United States Patent
Chang et al.

(10) Patent No.: US 10,755,945 B2
(45) Date of Patent: Aug. 25, 2020

(54) METAL CONTACTS ON METAL GATES AND METHODS THEREOF

(71) Applicant: Taiwan Semiconductor Manufacturing Co., Ltd., Hsin-Chu (TW)

(72) Inventors: Pang-Sheng Chang, Hsinchu (TW); Yu-Feng Yin, Hsinchu County (TW); Chao-Hsun Wang, Taoyuan County (TW); Kuo-Yi Chao, Hsinchu (TW); Fu-Kai Yang, Hsinchu (TW); Mei-Yun Wang, Hsin-Chu (TW); Feng-Yu Chang, Kaohsiung (TW); Chen-Yuan Kao, Hsinchu County (TW); Chia-Yang Hung, Kaohsiung (TW); Chia-Sheng Chang, Hsinchu (TW); Shu-Huei Suen, Hsinchu County (TW); Jyu-Horng Shieh, Hsin-Chu (TW); Sheng-Liang Pan, Hsin-Chu (TW); Jack Kuo-Ping Kuo, Hsinchu (TW); Shao-Jyun Wu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/035,819

(22) Filed: Jul. 16, 2018

(65) Prior Publication Data
US 2020/0020541 A1  Jan. 16, 2020

(51) Int. Cl.
*H01L 21/321* (2006.01)
*H01L 29/49* (2006.01)
*H01L 29/78* (2006.01)
*H01L 21/28* (2006.01)
*H01L 29/66* (2006.01)

(52) U.S. Cl.
CPC ...... *H01L 21/321* (2013.01); *H01L 21/28079* (2013.01); *H01L 29/495* (2013.01); *H01L 29/66795* (2013.01); *H01L 29/785* (2013.01)

(58) Field of Classification Search
CPC .................................................. H01L 21/321
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |

(Continued)

*Primary Examiner* — Kenneth Parker
*Assistant Examiner* — Christopher A Culbert
(74) *Attorney, Agent, or Firm* — Hayne and Boone LLP

(57) ABSTRACT

A method includes forming a metal gate structure, wherein the metal gate structure includes a gate dielectric layer and a gate electrode; performing a surface treatment to a top surface of the metal gate structure, wherein the surface treatment converts a top portion of the gate electrode to an oxidation layer; forming a conductive layer above the gate electrode, wherein the forming of the conductive layer includes substituting oxygen in the oxidation layer with a metallic element; and forming a contact feature above the metal gate structure, wherein the contact feature is in direct contact with the conductive layer.

20 Claims, 13 Drawing Sheets

(56) References Cited

U.S. PATENT DOCUMENTS

| | | |
|---|---|---|
| 9,236,300 B2 | 1/2016 | Liaw |
| 9,520,482 B1 | 12/2016 | Chang et al. |
| 9,576,814 B2 | 2/2017 | Wu et al. |
| 2007/0007522 A1* | 1/2007 | Tsao ..................... H01L 29/458 257/57 |
| 2016/0180960 A1* | 6/2016 | Lee ........................ G11C 17/16 711/125 |

* cited by examiner

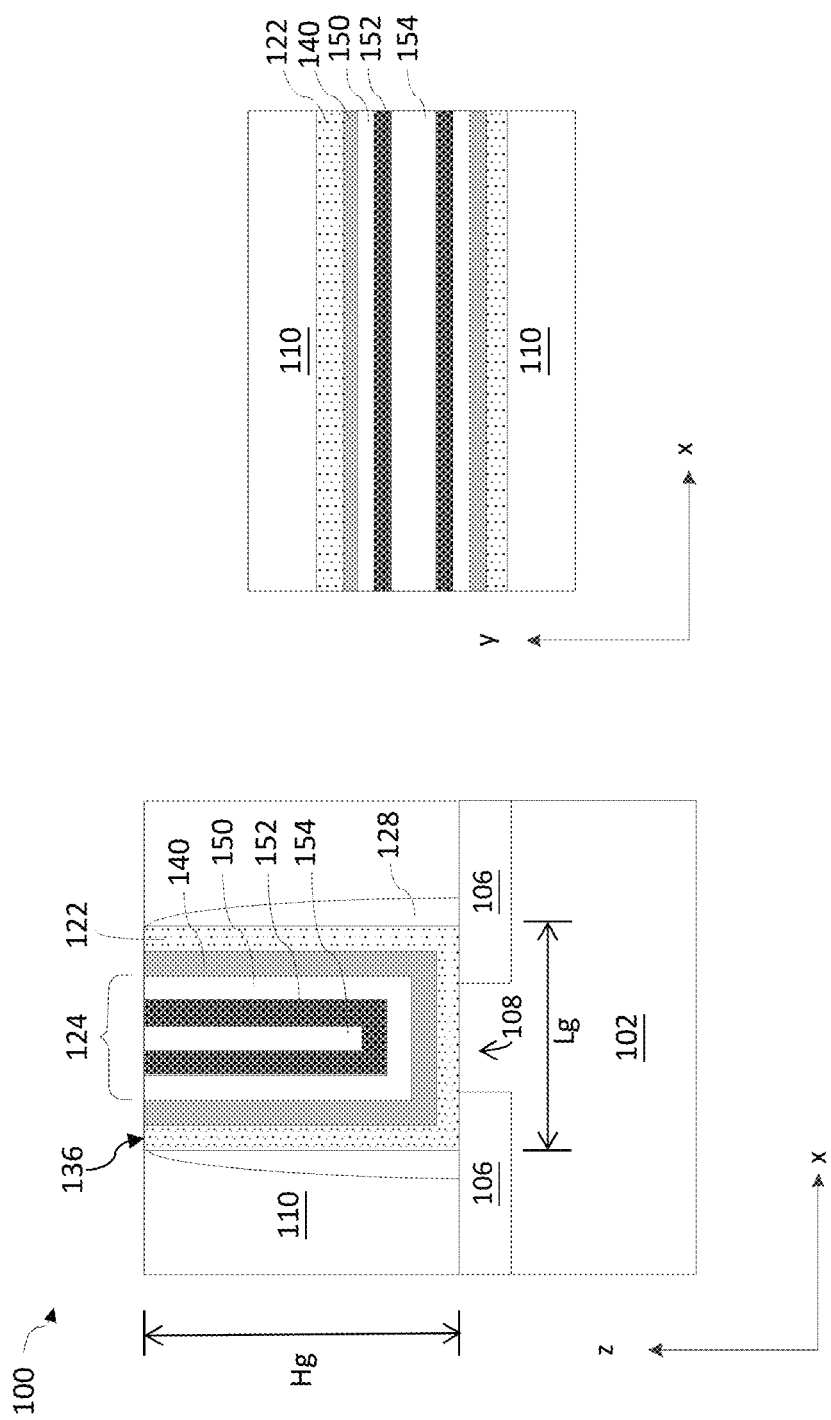

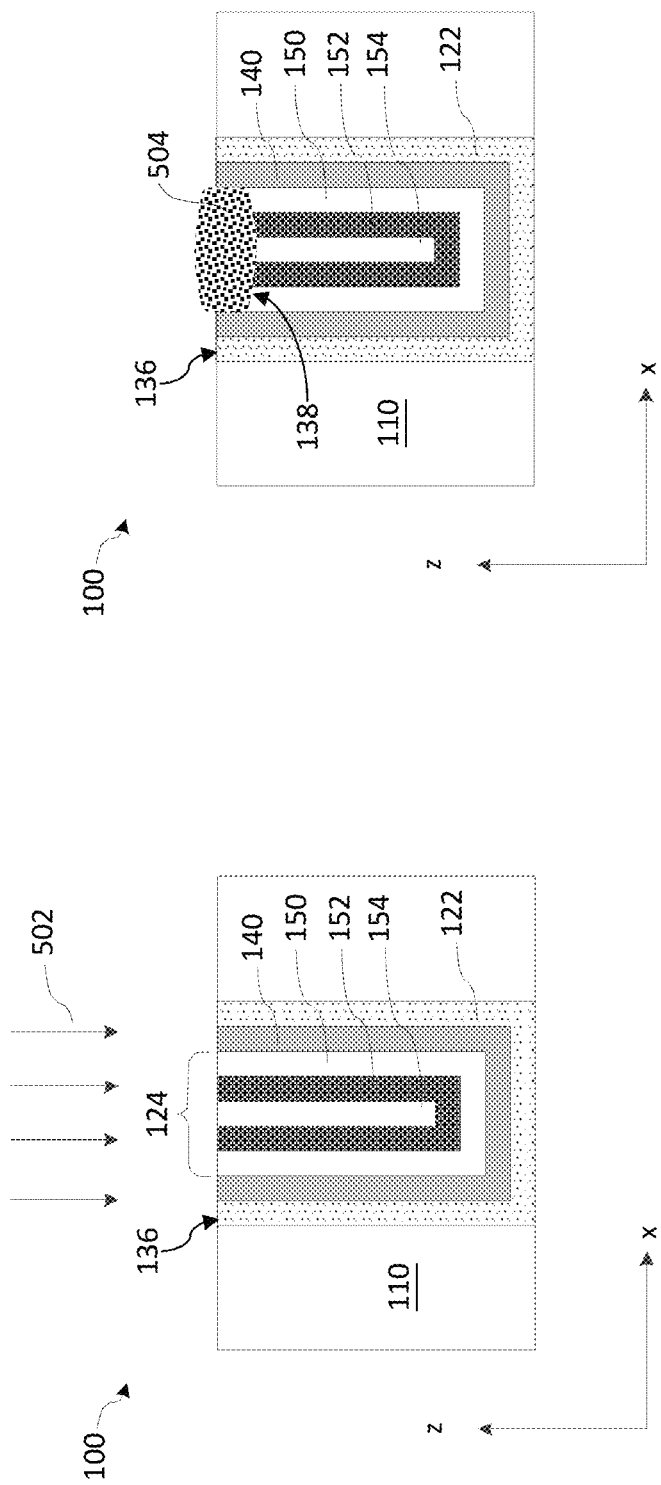

METAL CONTACTS ON METAL GATES AND METHODS THEREOF

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, polysilicon gates have been replaced by metal gates in an effort to improve device performance with decreased feature size. However, there are challenges associated with forming contact features on metal gates during device fabrication. In one example, interface between a contact feature and a metal gate can experience high resistance that is difficult to control due to reduced feature size. One possible improvement is to reduce resistance between the contact feature and the metal gate by growing a low resistive conductive layer therebetween. Meanwhile, there is a need to maintain electrical property stability of the metal gate without being interfered by the overlaid low resistive conductive layer. Therefore, further improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 4A, 5A, 5B, 6A, 7A, 7B, 7C, 7D, 7E, 7F, 7G, 7H, 8A, 9A, and 10A are fragmentary cross-sectional views of an exemplary device according to various aspects of the present disclosure.

FIGS. 1B, 4B, 6B, 8B, 9B, and 10B are plane top-views of the exemplary device as shown in FIGS. 1A, 4A, 6A, 8A, 9A, and 10A, respectively, according to various aspects of the present disclosure.

DETAILED DESCRIPTION

Figure 1:
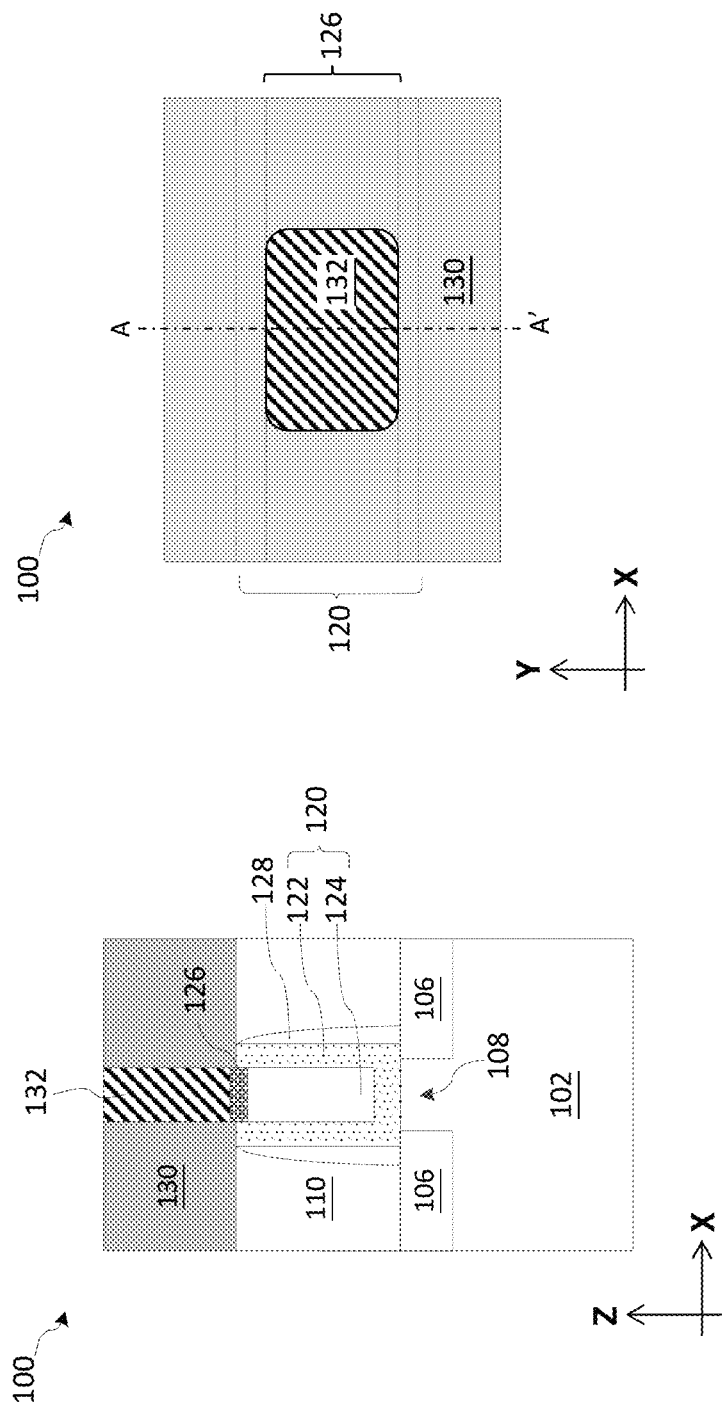

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to methods of semiconductor device fabrication, and more particularly to methods of forming contact features on metal gate structures. Upon forming a metal gate structure in a device, contact features are formed over a top surface of the metal gate structure to further device fabrication. However, as features sizes continue to decrease, a number of challenges arise during this stage of the fabrication. In one example, multiple work function metal (WFM) layers included in the metal gate electrode may result in a high-resistance interface with the contact feature, limiting the overall performance of the device. Furthermore, reduced feature size renders the electrical properties at the interface between the conductive feature and the top surface of the metal gate electrode difficult to control. Accordingly, the present disclosure provides structures aimed to reduce the contact resistance at the interface between metal gate structures and contact features, while maintaining electrical property (e.g., threshold voltage, gate resistance-capacitance delay, etc.) stability of the metal gate electrode. In some embodiments of the present disclosure, a conductive layer is formed between a metal gate structure and a contact feature in order to reduce high resistance at the interface between the metal gate structure and the contact feature caused by one or more work function metal layers present in the metal gate structure. The resistance reduction may be over 50% in various embodiments. The semiconductor devices disclosed herein may be, for example, complementary metal-oxide-semiconductor (CMOS) devices comprising a p-type metal-oxide-semiconductor (PMOS) device and an n-type metal-oxide-semiconductor (NMOS) device. With respect to structures, the devices may be two-dimensional, planar MOS field-effect transistor (MOSFET) devices (FIGS. 1A-1B) or three-dimensional, non-planar fin-like field effect transistor (Fin- FET) devices (FIG. 2). It is understood, however, that the present disclosure should not be limited to a particular type of device.

Figure 2:
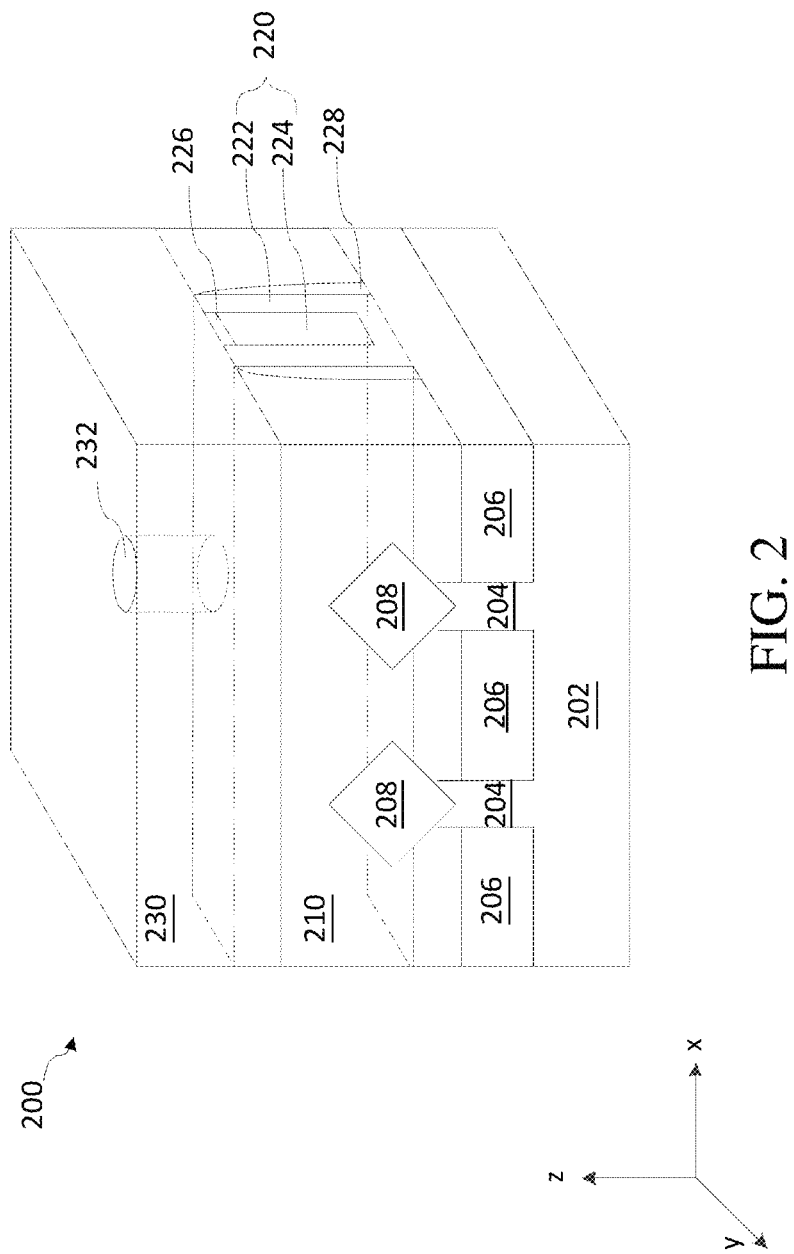
FIG. 2 is a three-dimensional perspective view of an exemplary device according to various aspects of the present disclosure.
Figure 3A:
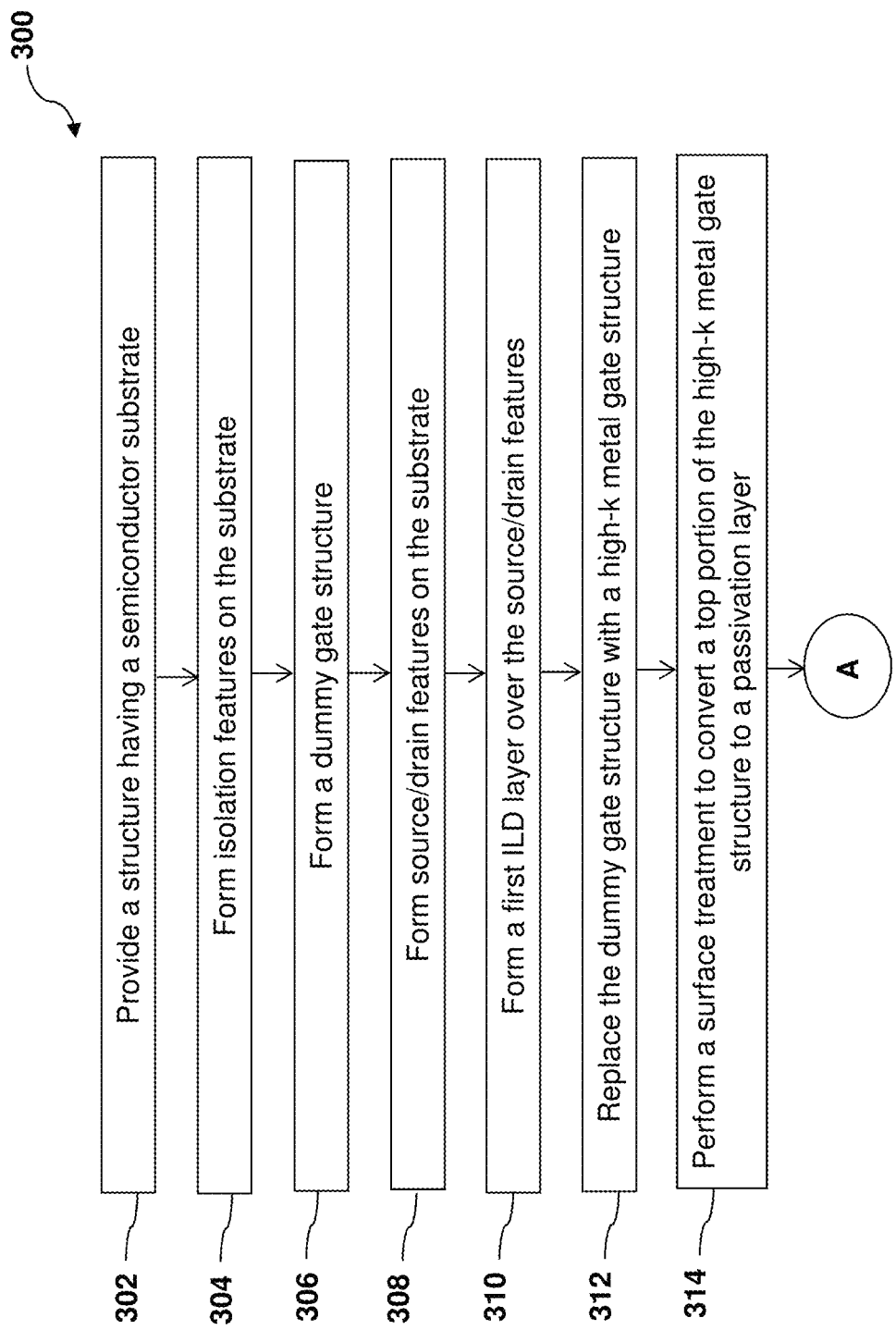
FIGS. 3A and 3B show a flowchart of an exemplary method for fabricating a semiconductor device according to various aspects of the present disclosure.
Figure 3B:
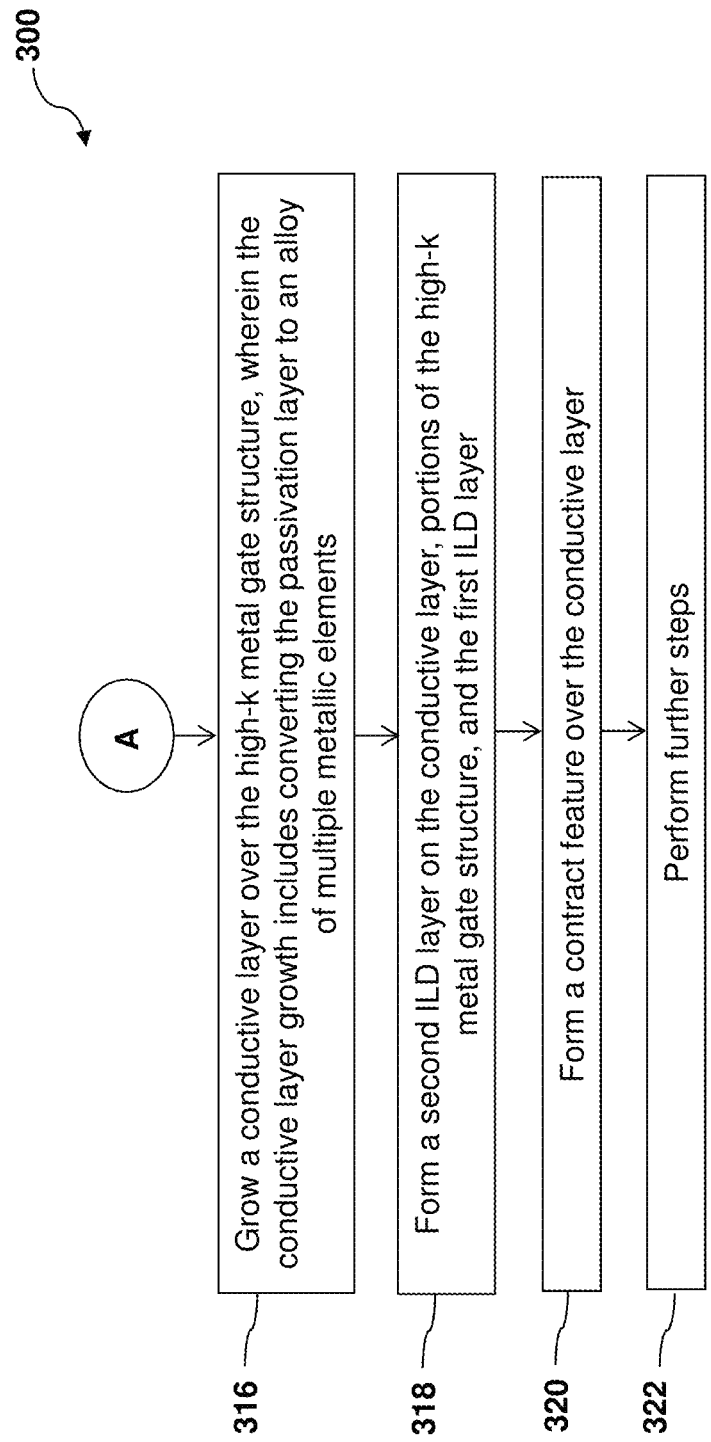

FIG. 1A illustrates a cross-sectional view of a semiconductor device (or a semiconductor structure) 100 taken along line AA' of a plane top view of the device 100 as shown in FIG. 1B. In some embodiments, FIGS. 1A and 1B illustrate a two-dimensional, planar device such as, for example, a PMOS device, an NMOS device, or a portion of a CMOS device, while FIG. 2 illustrates a three-dimensional PMOS or NMOS FinFET device. FIGS. 3A and 3B illustrate a flow chart of a method 300 for forming the semiconductor devices 100 and 200 according to various embodiments of the present disclosure. The method 300 is merely an example, and is not intended to limit the present disclosure beyond what is explicitly recited in the claims. Additional steps can be provided before, during, and after the processing methods provided herein, and some of the steps described can be replaced, eliminated, or moved around for additional embodiments of the present disclosure.

Referring to FIG. 3A, at operation 302, the method 300 provides a semiconductor substrate 102. The semiconductor substrate (or substrate) 102 includes an elementary semiconductor having a crystalline structure, such as, for example, silicon. Alternatively or additionally, the substrate 102 includes another elementary semiconductor, such as germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. Alternatively, the substrate 102 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 may further include other features such as a buried layer, and/or an epitaxial semiconductor layer grown in its upper portion. In some embodiments, the substrate 102 may include doped regions, such as n-wells and p-wells, depending upon the nature of a desired device. Doping the substrate 102 may be implemented by an ion implantation process, a diffusion process, an in-situ doping process, or combinations thereof.

At operation 304, the method 300 forms isolation features (not shown) on the substrate 102 to define active regions of the device 100. The isolation features may include, for example, silicon oxide, silicon nitride, silicon oxynitride, fluorine-doped silicate glass (FSG), a low-k dielectric material, other suitable dielectric materials, or combinations thereof. The isolation features can include structures such as shallow trench isolation (STI) structures, deep trench isolation (DTI) structures, and/or local oxidation of silicon (LOCOS) structures.

At operation 306, the method 300 forms a dummy gate structure (not shown)—portions of which are replaced in a subsequent step—over the substrate 102. The dummy gate structure may include a dummy interfacial layer comprising silicon oxide or silicon oxynitride and a dummy gate electrode comprising polysilicon. The dummy gate structure may be formed by a series of deposition and patterning processes. Thereafter, referring to FIGS. 1A and 4A, the operation 306 forms gate spacers 128 along sidewalls of the dummy gate structure. The gate spacers 128 may include a dielectric material, such as silicon oxide, silicon nitride, silicon oxynitride, silicon carbide, other dielectric material, or combinations thereof, and may be formed by a deposition process followed by an anisotropic etching process.

Still referring to FIGS. 1A and 4A, the method 300 then proceeds to operation 308 to form source/drain features 106 adjacent to the dummy gate structure, thereby forming a channel region 108 below the dummy gate structure and between the source/drain features 106. The source/drain features 106 may be n-type features for forming NMOS devices or p-type features for forming PMOS devices. In some embodiments, the source/drain features 106 may be formed by doping the source/drain regions in the substrate 102 adjacent to the dummy gate structure with one or more n-type dopants or p-type dopants, depending on the nature of the devices desired, by a method such as ion implantation. In alternative embodiments, the operation 308 forms the source/drain features 106 by epitaxially growing doped semiconductor material layer(s) in the source/drain regions, thereby forming raised source/drain feature 106. In further embodiments, the operation 308 forms the source/drain feature 106 by first recessing portions of the source/drain regions by etching to form trenches and subsequently epitaxially growing semiconductor layer(s) in the trenches. The epitaxially grown semiconductor material may be the same or different from the semiconductor material of the substrate 102. For example, for a p-type FET, the epitaxially grown semiconductor material is silicon germanium while the epitaxially grown semiconductor material for an n-type FET is silicon or silicon carbide. In some embodiment, the dopant is introduced into the source/drain feature 106 by in-situ doping. Specifically, the precursor for epitaxial growth further includes the dopant-containing chemical.

Thereafter, at operation 310, the method 300 forms a first ILD layer 110 over the source/drain features 106 and the isolation features (FIGS. 1A and 4A). The first ILD layer 110 may comprise any suitable dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), low-k dielectric material and/or other suitable dielectric materials. The first ILD layer 110 may comprise a multilayer structure or a single layer structure having multiple dielectric materials. For example, the first ILD layer 110 may include a thin etch stop layer (such as silicon nitride) and a low-k dielectric material layer. The operation 310 forms the first ILD layer 110 by a deposition process, such as spin-on coating, chemical vapor deposition (CVD), other suitable methods, or combinations thereof. The operation 310 further includes implementing a planarization process, such as chemical-mechanical polishing/planarization (CMP), following the deposition of the first ILD layer 110 to remove excess ILD material from the top surface of the device 100.

At operation 312, the method 300 replaces the dummy gate structure with a high-k metal gate (HK MG) structure 120 (FIGS. 1A, 4A, and 4B). The operation 312 removes portions of the dummy gate structure to form a gate trench (not shown) and subsequently forms the HK MG structure 120 in the gate trench by a deposition process. Thus formed gate material layers are U-shaped. Thereafter, a planarization process, such as CMP, is performed to remove excess metal gate material from the surface of the device 100. In some embodiments, the HK MG structure 120 has a gate height $H_g$ ranging from about 10 nm to about 35 nm and a gate length $L_g$ ranging from about 13 nm to about 28 nm.

Referring to FIGS. 1A, 4A, and 4B, the HK MG structure 120 includes a high-k gate dielectric (or gate dielectric) layer 122, a capping layer 140 covering the gate dielectric layer 122, and the gate electrode 124, and multiple metal layers 150, 152, and 154 that together form the gate electrode 124. In some embodiments, the gate electrode 124 may comprise additional metal layers. In further embodiments, the HK MG structure 120 may comprise additional material layers (not shown), such as interfacial layers, capping layers, diffusion layers, barrier layers, or combinations thereof. For example, the HK MG structure 120 may comprise an interfacial layer disposed between the channel region 108 and the gate dielectric layer 122. Material layers of the HK MG structure 120 may be formed by one or more suitable methods such as CVD, physical vapor deposition (PVD), atomic layer deposition (ALD), plating, other suitable methods, or combinations thereof. In some embodiments, one or more deposition methods are implemented to form U-shaped gate dielectric layer 122, capping layer 140, metal layers 150, 152, and 154 of the gate electrode 124, and any other material layers disposed between them, respectively, such that the material layers are configured with top surfaces coplanar with the top surface 136 of the HK MG structure 120.

The high-k dielectric layer 122 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The gate dielectric layer 122 may be deposited using CVD, ALD, and/or other suitable methods.

The capping layer 140 comprises one or more of the following: HfSiON, HfTaO, HfTiO, HfAlON, HfZrO, or other suitable materials, in various embodiments. In a specific embodiment, the capping layer 140 comprises titanium silicon nitride (TiSiN). Thus, the operation 312 may further comprise, following forming the gate dielectric layer 122, co-sputtering the capping layer 140 on the gate dielectric layer 122 by a method such as rapid thermal anneal (RTA) implemented in nitrogen gas. In many embodiments, the capping layer 140 provides improved thermal stability for the HK MG 120 and serves to limit diffusion of metallic impurity from the gate electrode 124 into the gate dielectric layer 122.

The gate electrode 124 may include one or more metal layers, such as work function metal (WFM) layer(s), conductive barrier layer(s), and bulk conductive layer(s). In one example, the gate electrode 124 comprises two distinct WFM layers 150, 152 and a bulk conductive layer 154 in the center as a metal fill. The bulk conductive layer 154 may comprise tungsten. In yet another example, the gate electrode 124 comprises three distinct WFM layers 150, 152, and 154. In some other examples, the gate electrode 124 may include additional WFM layers and bulk conductive layers.

The WFM layer may be a p-type or an n-type work function layer depending on the type of the device (PMOS or NMOS) desired. A p-type WFM layer comprises a metal with a sufficiently large effective work function and can comprise one or more of the following: titanium nitride (TiN) tantalum nitride (TaN), and tungsten nitride (WN), other suitable metals, or combinations thereof. For example, metal layers 150, 152, and 154 may be three distinct p-type WFM layers. In a specific example, the metal layers 150, 152, and 154 includes a tantalum nitride (TaN) layer, a titanium nitride (TiN) layer, and a titanium aluminum (TiAl) layer, respectively. The TaN layer, TiN layer, and TiAl layer may be in any other suitable sequence in the WFM layers, such as a TaN layer in the center, a TiN layer in the middle, and a TiAl layer on the side of the gate electrode 124. In some alternative embodiments, the metal layers 150, 152, and 154 may be three distinct n-type WFM layers. An n-type WFM layer comprises a metal with sufficiently low effective work function and can comprise one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, or combinations thereof. Alternatively, the metal layers 150 and 152 may be two distinct WFM layers, while the metal layer 154 may be a bulk conductive layer. The bulk conductive layer may include aluminum (Al), copper (Cu), titanium (Ti), tantalum (Ta), tungsten (W), platinum (Pt), molybdenum (Mo), cobalt (Co), silver (Ag), manganese (Mn), zirconium (Zr), ruthenium (Ru), and/or other suitable materials. The gate electrode 124 may include multiple WFM layers or alternatively, multiple WFM layers and a bulk conductive metal layer. The gate electrode 124 may be formed by one or more deposition methods, such as CVD, PVD, ALD, plating, and/or other suitable methods.

Referring to FIGS. 3A, 5A and 5B, the method 300 proceeds to operation 314 to perform a surface treatment to the top surface 136 of the HK MG structure 120 to convert a top portion of the gate electrode 124 to a passivation layer 504. In one embodiment, the surface treatment includes an oxidation process and the passivation layer 504 includes metal oxide. In another embodiment, the surface treatment includes a nitridation process and the passivation layer 504 includes metal nitride and/or metal oxynitride. The surface treatment may include any suitable technique such as thermal growth and plasma treatment. In some embodiments, as shown in FIG. 5A, the top surface 136 of the HK MG structure 120 is treated with a plasma 502 comprising a gas selected from oxygen ($O_2$), a mixture of oxygen ($O_2$) and nitrogen ($N_2$), and ammonia ($NH_3$). The gas flow in the plasma treatment may range between about 100 sccm to about 10000 sccm. The plasma may be implemented with an applied bias voltage in the range between about 50 W and about 5000 W at an operation temperature between about 150 degree Celsius and 350 degree Celsius and under a processing pressure ranging between about 50 mTorr and about 4000 mTorr. In an exemplary embodiment, the duration of the treatment is about 10 seconds to about 50 seconds.

In the illustrated embodiment, operation 314 is an oxidation surface treatment by applying $O_2$ plasma to the top surface 136 of the HK MG structure 120. The $O_2$ plasma is implemented with a gas flow between about 8000 sccm and about 10000 sccm, under an applied bias voltage in the range between about 3000 W and about 5000 W, at a temperature of about 200 degree Celsius, and under a processing pressure at about 1100 mTorr. The oxidation surface treatment process may be carried out for about 30 seconds. Before the oxidation surface treatment, top surfaces of the WFM layers 150, 152, and 154 may include native oxide associated with respective WFM layers. Such native oxide may be non-continuous and non-uniform. The oxidation surface treatment aims to oxidize top surfaces of the WFM layers 150, 152, and 154 and form a uniform oxidized layer 504, as shown in FIG. 5B. The oxidized layer 504 has regular boundaries, such as a smooth bottom surface 138 interfacing with the gate electrode 124 thereunder. As to be shown in subsequent operations, the oxidized layer 504 is to be converted to a low resistive conductive layer. The low resistive conductive layer will be confined within the smooth bottom surface 138, without extruding further into the WFM layers of the gate electrode 124, which helps maintaining electrical property (e.g., threshold voltage, gate resistance-capacitance delay, etc.) stability of the gate electrode 124. The oxidized layer 504 may have a top portion about 1 nm to about 3 nm above the top surface 136 of the gate electrode 124 and a bottom portion about 2 nm to about 8 nm below the top surface 136 of the gate electrode 124. The height of the top portion and the height of the bottom portion may have a ratio ranging from about 1:8 to about 1.5:1. In one embodiment, the metal layer 154 exhibits a faster oxidation rate than the metal layers 152 and 150, and the top portion of the oxidized layer 504 has a convex shape with a center region higher than peripheral regions. In another embodiment, the metal layer 154 exhibits a slower oxidation rate than the metal layers 152 and 150, and the top portion of the oxidized layer 504 has a concave shape with a center region lower than peripheral regions.

In some other embodiments, operation 314 is a nitridation surface treatment and the plasma includes a mixture of $O_2$ and $N_2$. Correspondingly, the nitridated layer 504 includes a mixture of oxide and oxynitride. In yet another embodiment, operation 314 is a hydrogenation surface treatment and the plasma includes $NH_3$. Consequently, the hydrogenized layer 504 includes hydrogen. Advantageously, the surface treatment implemented during the operation 314 may be carried out in the same tool as the subsequent steps of forming the conductive layer 126 and the contact feature 132.

Referring to FIG. 3B, at operation 316, the method 300 grows the conductive layer 126 on the top surface of the HK MG structure 120. Operation 316 may include a deposition process, such as an ALD process, a CVD process, other suitable methods, or combinations thereof. As depicted in FIG. 6A, in some embodiments, the operation 316 implements an ALD process 602 with gaseous precursors that comprises a conductive element, such as W, Co, Ti, Al, Cu, Au, or combinations thereof. The inventors have observed that by selecting certain precursor compositions and adjusting proper process conditions, a substitution reaction between the deposited conductive element and non-conductive elements (e.g., Oxygen and Nitrogen) in the passivation layer 504 occurs. Without wishing to be bound by theory, the inventors have observed such substitution reaction substantially converts the compound of the passivation layer 504 to an alloy comprising the conductive element introduced from the gaseous precursors and those original metal elements from the WFM layers. Extra conductive element may be further deposited above the alloy as a metal film during the deposition process. The alloy, as a main portion of the conductive layer 126, extends from a position below the top surface 136 of the HK MG structure 120 to a position above the top surface 136. As such, the low resistive conductive layer 126 substitutes the high resistive passivation layer 504 with regular boundaries, such as the smooth bottom surface 138 interfacing with the gate electrode 124 thereunder. As to be shown in subsequent operations, a contact feature is to be formed directly above the conductive layer 126. The contact resistance at the interface between the contact feature and the conductive layer 126 is generally lower than the contact resistance between the contact feature and the top surface of the gate electrode 124 if in direct contact, due to interfaces of multiple high-resistance WFM layers. Such resistance reduction can be over 50% in various embodiments.

Figure 6B:
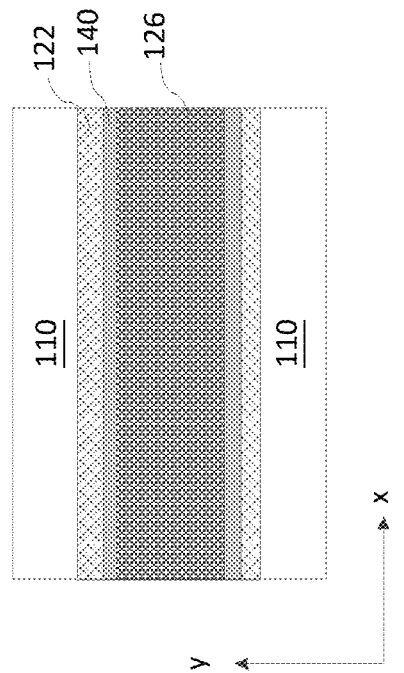
Figure 6A:
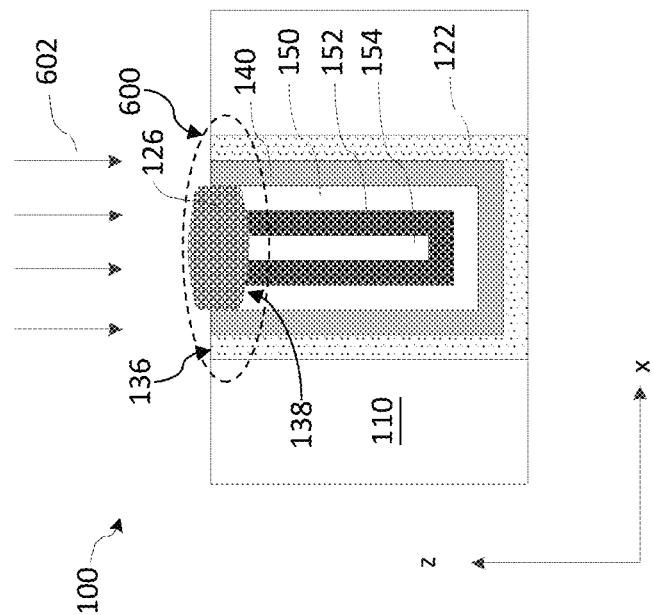

As depicted in FIGS. 6A and 6B, in some embodiments, the deposition process implemented by the operation 316 is a selective deposition process such that the conductive layer 126 is selectively formed on and self-aligned with the metal layers 150, 152, and 154 of the gate electrode 124 and is not formed over the gate dielectric layer 122 or the capping layer 140. In the illustrated embodiment, operation 316 begins with an ALD process 602 that sequentially exposes the top surface of the HK MG structure 120 to two different gaseous precursors in a cyclic manner, i.e., alternating application of a first gaseous precursor and a second gaseous precursor to the top surface of the HK MG structure 120. The first gaseous precursor may comprise a compound including a conductive element, such as W, Co, Ti, Al, Cu, Au, or combinations thereof, and a halogen, such as chlorine (Cl) or fluorine (F). In exemplary embodiments, the first gaseous precursor may be tungsten chloride ($WCl_5$), tungsten fluoride ($WF_6$), titanium chloride ($TiCl_4$), or other suitable materials. The second gaseous precursor comprises elements such as silicon (Si) and hydrogen (H). Examples of the second gaseous precursor include hydrogen ($H_2$) and silane ($SiH_4$). In a specific embodiment, the first gaseous precursor includes $WCl_5$ and the second gaseous precursor includes $H_2$. In another specific embodiment, the first gaseous precursor includes $WF_6$ and the second gaseous precursor includes $SiH_4$. The operation 316 implements the deposition process at a temperature ranging between about 400 degree Celsius and about 520 degree Celsius with a processing pressure ranging between about 5 Torr and 50 Torr. In some embodiments, the deposition process may be carried out for about 10 minutes to about 120 minutes.

Figure 7A:
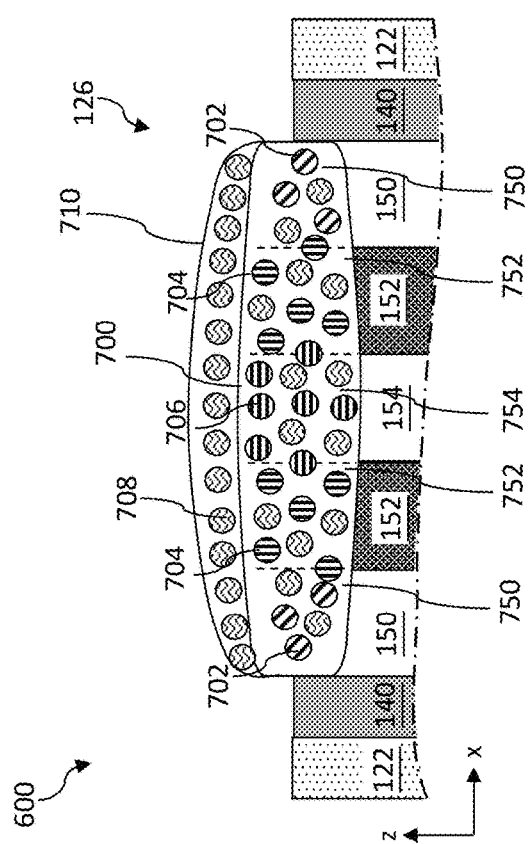

An enlarged illustration of a region 600 surrounding the conductive layer 126 is depicted in FIGS. 7A-7F. The WFM layers 150, 152, and 154 may comprises different metal elements, denoted as first metal 702, second metal 704, and third metal 706, respectively. For example, the metals 702, 704, and 706 may be tantalum (Ta), titanium (Ti), and aluminum (Al), respectively. Referring to FIG. 7A, the conductive layer 126 comprises the alloy 700, which is a compound of the first metal 702, second metal 704, third metal 706, and fourth metal 708 substituted into the compound during operation 316. The alloy 700 is self-aligned with the WFM layers 150, 152, and 154 and is not formed over the gate dielectric layer 122 or the capping layer 140. Based on spatial relationships with the WFM layers directly below, the alloy 700 can be divided into several regions, such as side region 750 directly above the WFM layer 150, middle region 752 directly above the WFM layer 152, and center region 754 directly above the WFM layer 154. The side region 750 is rich with first metal 702 (i.e., first metal 702 outnumbers second metal 704 or third metal 706), the middle region 752 is rich with second metal 704, and the center region 754 is rich with third metal 706, in which all regions have fourth metal 708. In some embodiments, there are no explicit boundaries between two adjacent regions 750, 752, or 754, since respective metals of each region may diffuse into an adjacent region around the boundaries. In some alternative embodiments, the metals 702, 704, 706, and 708 further diffuse into each region, for example, due to an optional heating or anneal treatment in operation 316, such that each region has substantially the same metal alloy composition without a dominantly rich metal. The conductive layer 126 may have a top portion about 1 nm to about 3 nm above the top surface 136 of the gate electrode 124 and a bottom portion about 2 nm to about 8 nm below the top surface 136 of the gate electrode 124. The height of the top portion and the height of the bottom portion may have a ratio ranging from about 1:8 to about 1.5:1.

Figure 7B:
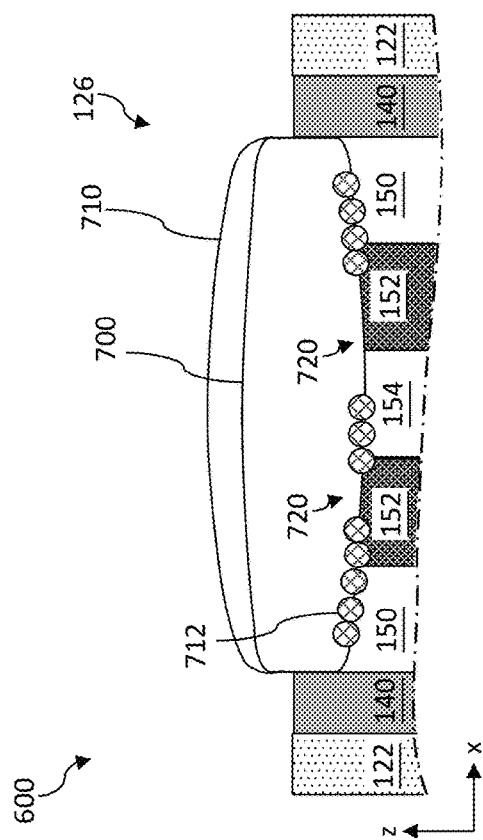

Referring to FIG. 7B, the conductive layer 126 further includes a metal film 710 covering the alloy 700 in some embodiments. The metal film 710 comprises the fourth metal 708. The metal film 710 is free of the first metal 702, second metal 704, and third metal 706, in some embodiments. For example, the metal film 710 may be a layer of tungsten (W). In various other embodiments, the metal film 710 includes metals selected from tungsten (W), cobalt (Co), titanium (Ti), aluminum (Al), copper (Cu), gold (Au), other suitable metals, or combinations thereof. The metal film 710 is formed by increasing the deposition time of the first and second gaseous precursors (e.g., $WCl_5/H_2$ precursors or $WF_6/SiH_4$ precursors) implemented in a cyclic manner during the operation 316 after forming the alloy 700. The deposition of the metal film 710 on surface of the alloy 700 may include a chemical reaction termed "electron exchange," which facilitates the forming of a more uniform low resistive metal film 710. The metal film 710 may have a thickness of about 1 nm to about 20 nm in some embodiments.

Figure 7C:
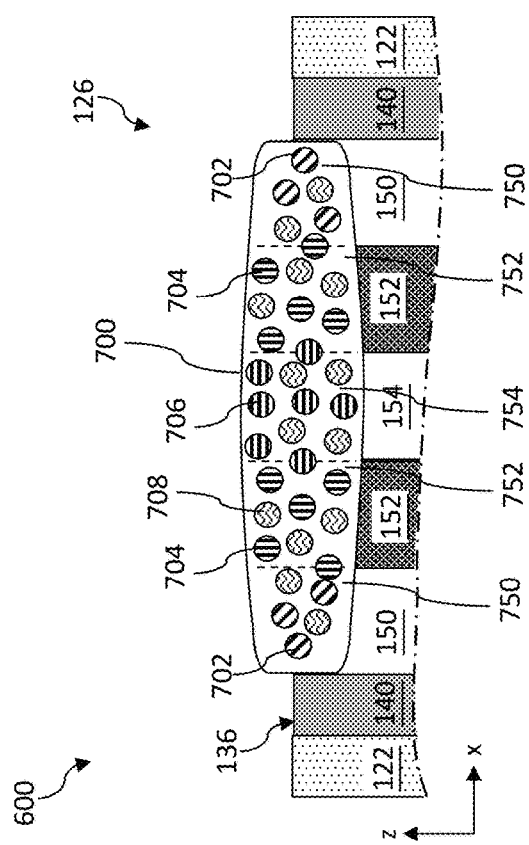
Figure 7D:
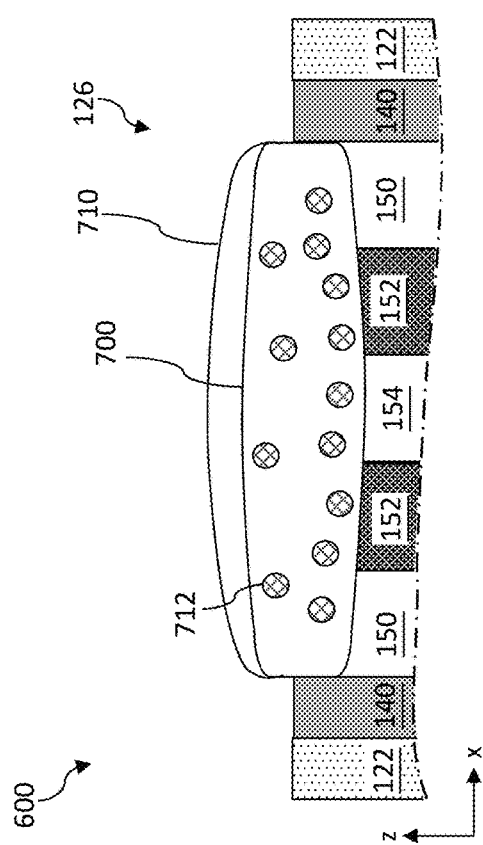

Referring to FIG. 7C, the conductive layer 126 may further comprise residuals 712 from the passivation layer 504, in some embodiments. The symbolic drawings of metals 702, 704, 706, and 708 are omitted herein for the sake of clarity. Depending on the material compositions of the passivation layer 504, the residuals 712 may be metallic oxide, metallic nitride, or metallic oxynitride that has not been completely substituted by the fourth metal 708 during operation 316. Closer to the bottom of the conductive layer 126, the residuals 712 has a higher chance from being substituted. Therefore, bottom portion of the conductive layer 126 can be considered as a result of molecular intermixing between the alloy 700 and the non-metallic residuals 712 (e.g., metallic oxide) with a concentration of the residuals 712 increasing in a direction towards the gate electrode 124 beneath. In yet another embodiment, the residuals 712 is accumulated in an interface between the conductive layer 126 and the gate electrode 124, while the body of the conductive layer 126 is substantially free of the residuals 712, as schematically shown in FIG. 7D. The residuals 712 may not form continuously along the interface between the conductive layer 126 and the gate electrode 124, leaving abundant openings 720 that allows the conductive layer 126 to sufficiently directly contact with the gate electrode 124.

Figure 7E:
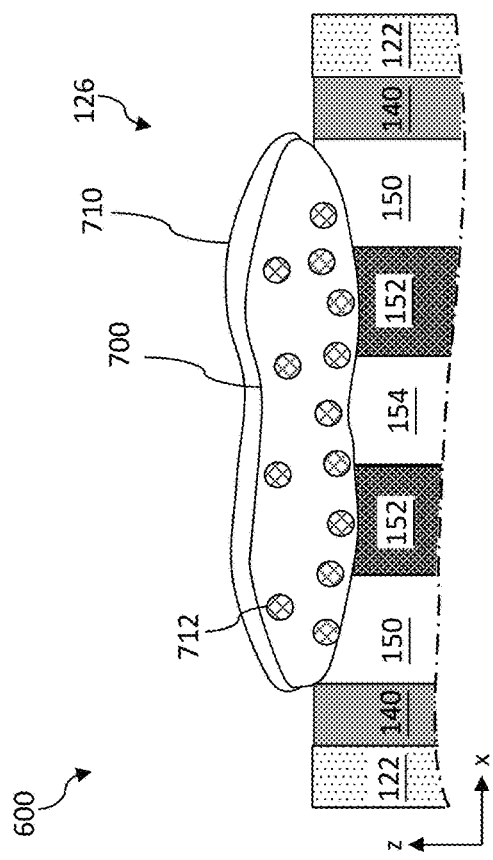

Referring to FIG. 7E, a portion of the conductive layer 126 may extend laterally to contact top surfaces of the capping layer 140, in some embodiments. The capping layer 140 may comprise a material composition that could evolve in the passivation reaction in operation 314. For example, the capping layer 140 may include titanium silicon nitride (TiSiN), which can be oxidized during an oxidation surface treatment in operation 314. Even though capping layer 140 may have an oxidation rate much slower than the WFM layers of the gate electrode 124, nevertheless prolonged oxidation time causes the passivation layer 504 to extend laterally to the top portion of the capping layer 140. Subsequently, as discussed above, the passivation layer 504 is converted to a portion of the conductive layer 126 in operation 316, including the top portions of the capping layer 140.

Figure 7F:
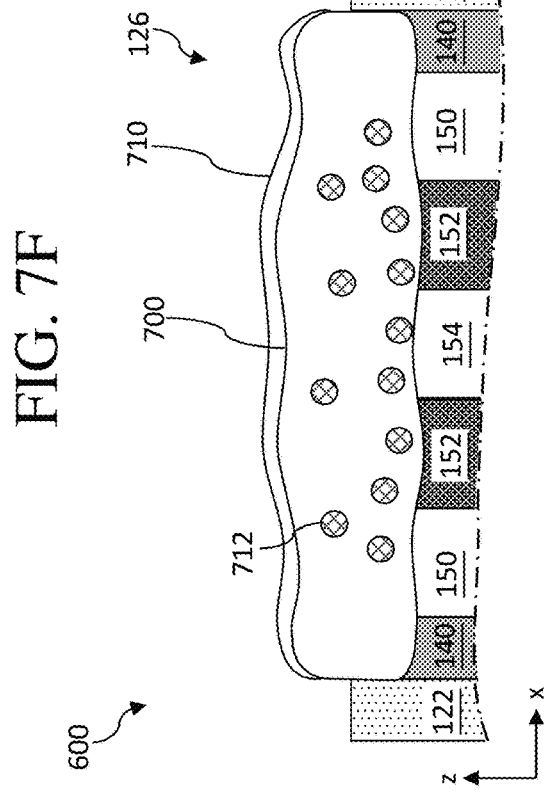

Referring to FIG. 7F, a top surface of the conductive layer 126 may have a concave shape with a point in center region lower than some points in peripheral regions, in some embodiments. When the WFM layer 154 exhibits a faster oxidation rate than the metal layers 152 and 150, the top portion of the oxidized layer 504 will have a convex shape with a center region higher than peripheral regions. Subsequently, the alloy 700 and the metal film 710 will also exhibit the convex shape. Yet, when the metal layer 154 exhibits a slower oxidation rate than the metal layers 152 and 150, the top portion of the oxidized layer 504 has a concave shape with a center region lower than peripheral regions. Subsequently, the alloy 700 and the metal film 710 will also exhibit the concave shape. Similarly, the bottom surface of the conductive layer 126 may also exhibit a concave shape with a point in center region higher than some points in peripheral regions.

Figure 7G:
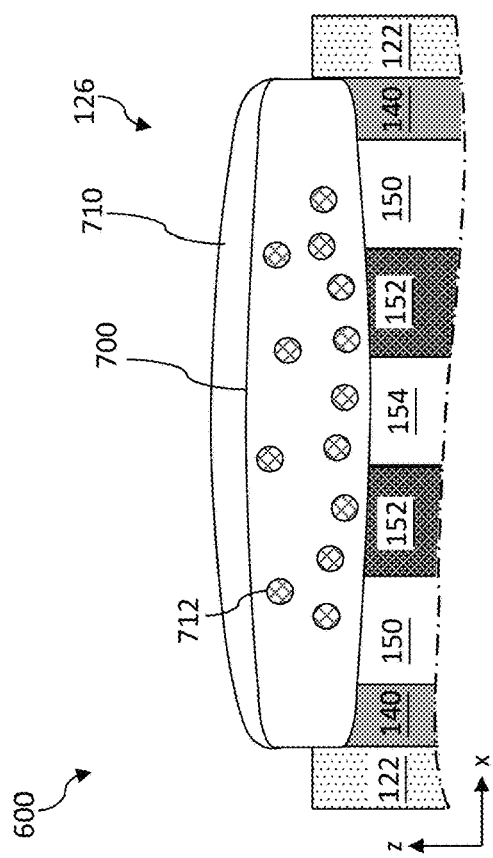
Figure 11:
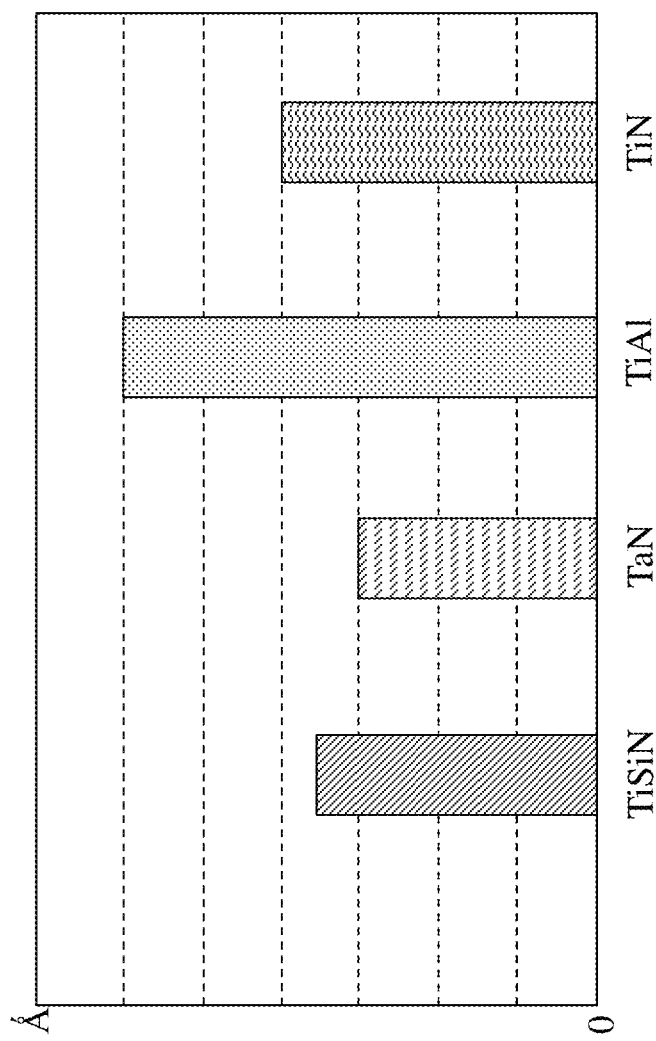
FIG. 11 shows oxidation rate comparison of different materials under the same oxidation surface treatment.

In a specific embodiment, the capping layer 140 comprises titanium silicon nitride (TiSiN), while the WFM layers 150, 152, and 154 include a tantalum nitride (TaN) layer, a titanium nitride (TiN) layer, and a titanium aluminum (TiAl) layer, respectively. FIG. 11 illustrates oxidation rate comparison among these four materials under a specific oxidation surface treatment. The TiAl exhibits highest oxidation rate than the other materials. Correspondingly, the alloy 700 will have the highest point above the WFM layer 154. To be noticed, the capping layer material TiSiN exhibits higher oxidation rate than WFM layer materials TaN under this specific oxidation surface treatment. Therefore, the alloy 700 also extends to above the capping layer 140, as shown in FIG. 7G. Meanwhile, the alloy 700 above the capping layer 140 may be higher than the portion above the WFM layer 150.

Figure 7H:
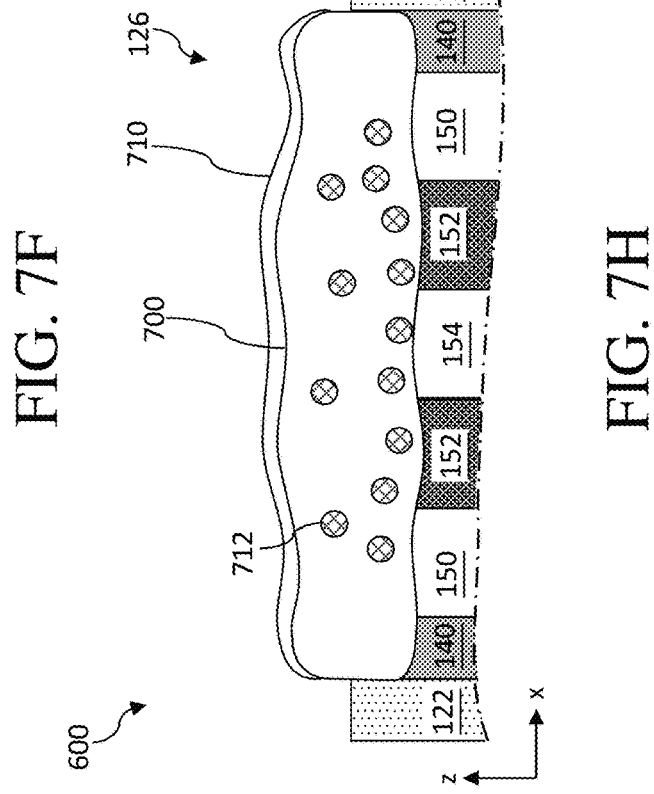

In yet another specific embodiment, the capping layer 140 comprises titanium silicon nitride (TiSiN), while the WFM layers 150, 152, and 154 include a tantalum nitride (TaN) layer, a titanium aluminum (TiAl) layer, and a titanium nitride (TiN) layer, respectively. Still referring to the oxidation rate comparison chart illustrated in FIG. 11, the TiAl exhibits highest oxidation rate than the other materials. Correspondingly, the alloy 700 will have the highest point above the WFM layer 152, forming a concave shape above the center of the metal gate electrode, as shown in FIG. 7H. Meanwhile, the oxidation rate of the capping layer material TiSiN allows the alloy 700 to extend continuously above the capping layer 140. As shown in FIG. 7H, the alloy 700 above the capping layer 140 may be higher than the portion above the WFM layer 150, due to higher oxidation rate of TiSiN than TaN in the specific oxidation surface treatment.

Figure 8B:
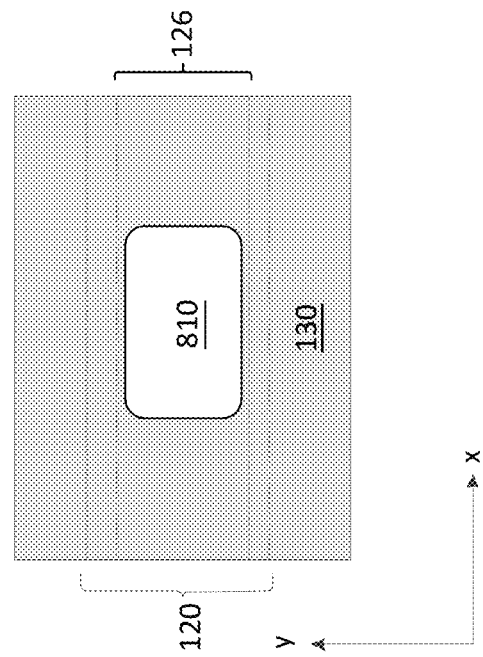
Figure 8A:
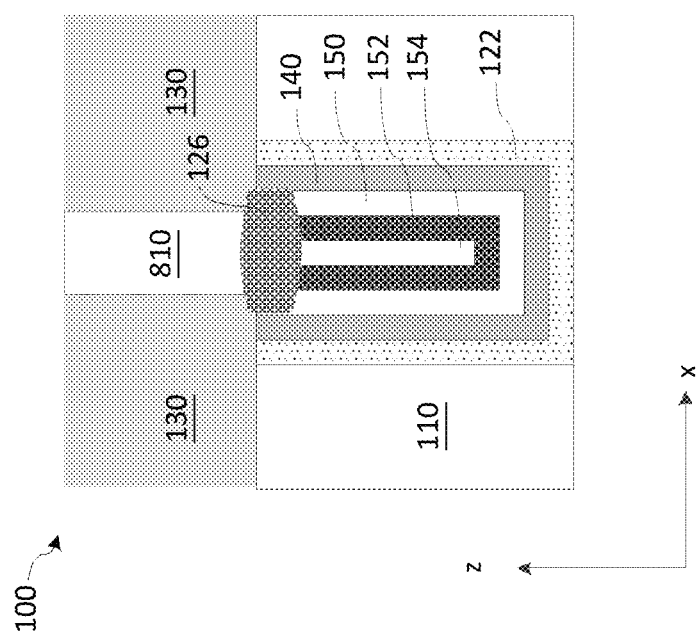

At operation 318, referring to FIGS. 8A and 8B, the method 300 forms a second ILD layer 130 over the conductive layer 126, portions of the HK MG structure 120, and the first ILD layer 110. The second ILD layer 130 may comprise a material that is the same as or different from the first ILD layer 110, and may be, for example, TEOS, un-doped silicate glass, BPSG, FSG, PSG, BSG, low-k dielectric material, and/or other suitable dielectric. The operation 318 forms the second ILD layer 110 by a deposition process, such as spin-on coating, CVD, other suitable methods, or combinations thereof. The operation 318 may further include implementing a CMP process to remove excess ILD material from the top surface of the device 100.

The method 300 proceeds to operation 320 to form contact feature 132. The operation 320 may include multiple steps, such as patterning, deposition, and CMP. First, the operation 320 performs a patterning process (including lithography process and etching) to form (i.e., to pattern) an opening 810 in the second ILD layer 130 which corresponds to a planar shape of the contact feature 132 from a top view (FIG. 8B). In the illustrated embodiment, the contact feature 132 is configured to have a rectangular shape with rounded corners. In many other embodiments, the contact feature 132 is configured to have a circular (e.g., the contact feature 232 of the FinFET device 200 in FIG. 2), square, rectangle, or other planar shapes. In the depicted embodiment, the opening 810 is formed directly above the top surface of the gate electrode 124 (i.e., metal layer 150, 152, and 154). The patterning process may include forming a patterned resist layer (not shown) over a hard mask layer (not shown) via photoresist coating, exposing, post-exposure baking, and developing. The hard mask layer may include a material different from that of the ILD layer 130, such as silicon oxide, silicon nitride, silicon carbide, silicon oxynitride, or other suitable materials, and may be formed by a suitable method, such as thermal oxidation, CVD, PVD, ALD, other suitable methods, or a combination thereof. Thereafter, the hard mask layer is etched using the patterned photoresist as an etch mask to form the opening in the second ILD layer 130. The etching process may include wet etching, dry etching, reactive ion etching, or other suitable etching methods.

Figure 9B:
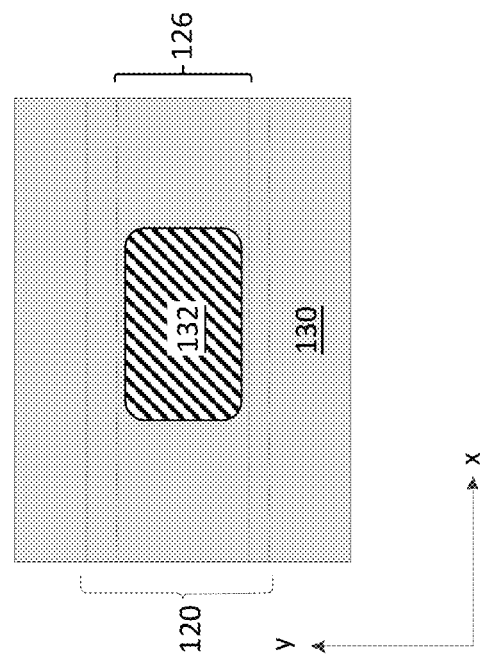
Figure 9A:
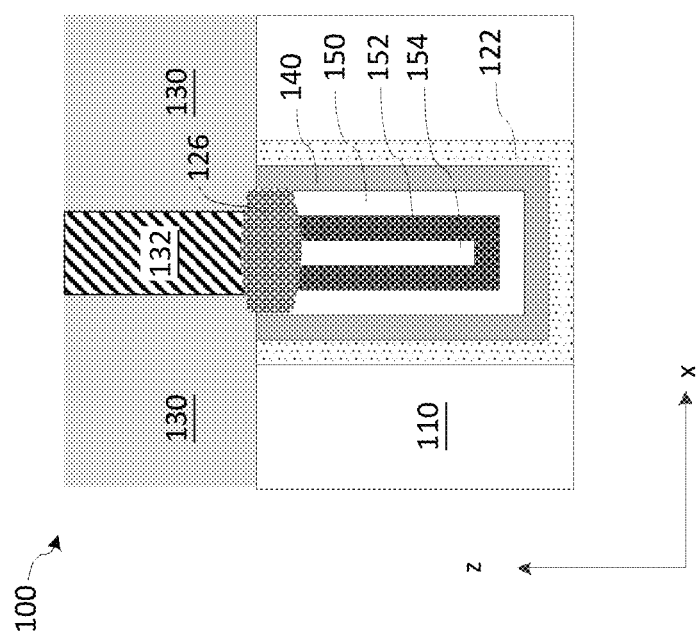

Then, referring to FIGS. 9A and 9B, the contact feature 132 is formed in the opening 810 of the second ILD layer 130 by deposition. In some embodiments, the contact feature 132 comprises tungsten (W), cobalt (Co), aluminum (Al), copper (Cu), titanium (Ti), tantalum (Ta), platinum (Pt), molybdenum (Mo), silver (Ag), manganese (Mn), zirconium (Zr), ruthenium (Ru), other suitable conductive materials, or combinations thereof. The contact feature 132 may comprise a material that is the same as or different from the metal film 710 of the conductive layer 126. For example, if the metal film 710 of the conductive layer 126 comprises metallic tungsten, then the contact feature 132 may comprise metallic tungsten, metallic cobalt, and/or metallic aluminum. In some embodiments, the operation 320 forms the contact feature 132 by a deposition process such as CVD, PVD, ALD, plating, other suitable methods, or combinations thereof. In an exemplary embodiment, the contact feature 132 is formed by a CVD process, which is different from ALD. In the depicted embodiments, the contact feature 132 is formed using a continuous deposition technique, during which a single gaseous species is used to complete the deposition process. Advantageously, the contact resistance at the interface between the contact feature 132 and the conductive layer 126 is generally lower than the contact resistance at the interface between the contact feature 132 and the top surface of the gate electrode 124 (including metal layers 150, 152, and 154), thereby mitigating the effect of high-resistance interface between the multiple WFM layers of the HK MG structure 120 and the contact feature 132. Thereafter, one or more planarization process, such as CMP, may be performed to remove any excess material from the top surface of the device 100.

Figures 10A, 10B:
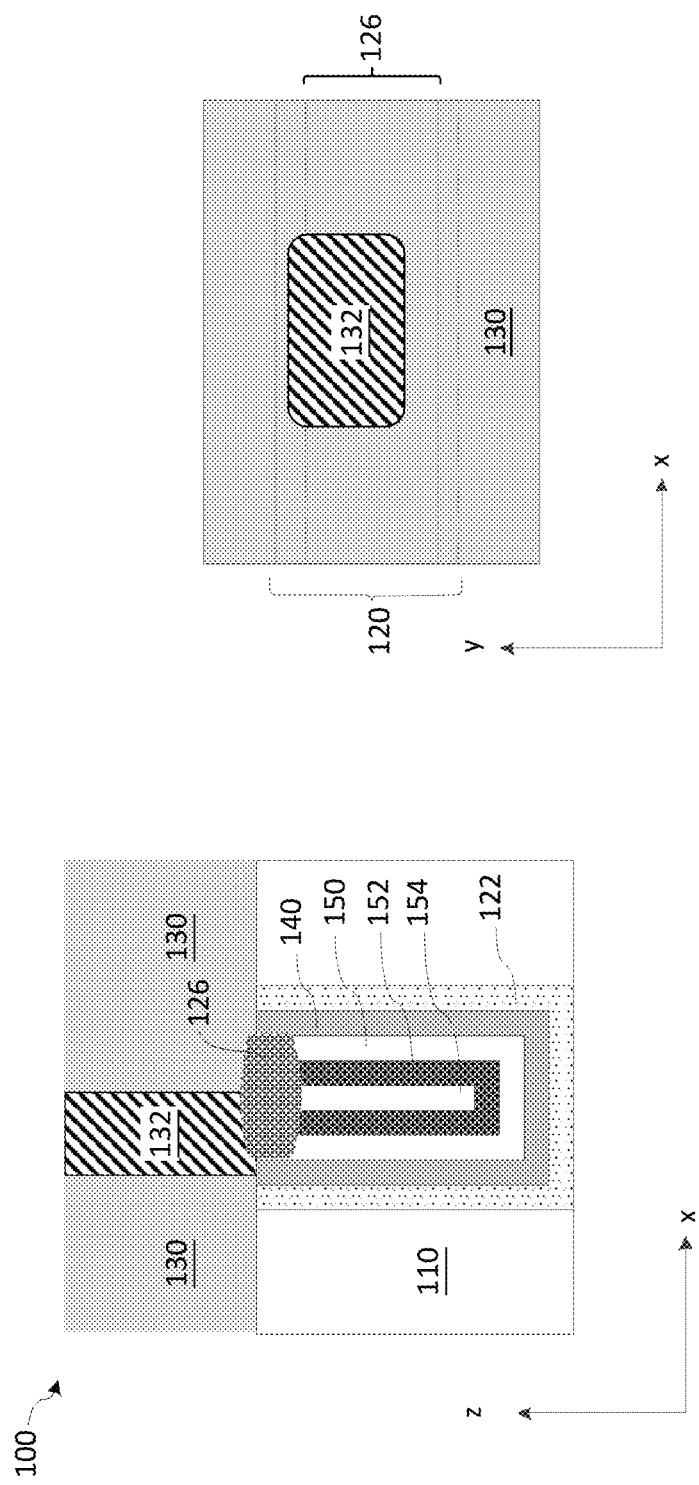

Also, referring to FIGS. 10A and 10B, in the depicted embodiment, the contact feature 132 (i.e., of the opening formed in the second ILD 130) is offset from the center of the gate electrode by a certain distance, indicating that misalignment has occurred during the patterning process. A portion of the contact feature 132 may land on the capping layer 140 or also on the gate dielectric layer 122. The contact feature 132 can still establish a low-resistance interface with the conductive layer 126 despite the misalignment, due to the low resistivity of the conductive layer 126 as discussed above.

At operation 322, the method 300 performs further steps to complete the fabrication of the semiconductor device 100. The semiconductor device 100 may be included in a microprocessor, a memory, and/or other integrated circuit device. In some embodiments, the semiconductor device 100 may be a portion of an IC chip, a system on chip (SoC), or portion thereof, that includes various passive and active microelectronic devices such as resistors, capacitors, inductors, diodes, metal-oxide semiconductor field effect transistors (MOSFET), CMOS transistors, bipolar junction transistors (BJTs), laterally diffused MOS (LDMOS) transistors, high voltage transistors, high frequency transistors, other suitable components, or combinations thereof. Additional features can be added to the semiconductor device 100 by subsequent processing steps. For example, various vertical interconnect features such as contacts and/or vias, and/or horizontal interconnect features such as lines, and multilayer interconnect features such as metal layers and interlayer dielectrics can be formed over the substrate 102, configured to connect the various features or structures of the semiconductor device 100.

Embodiments of the method 300 may also be implemented to form a three-dimensional, non-planar device such as a FinFET device 200 depicted in FIG. 2. In some embodiments, the method 300 provides a semiconductor substrate 202 and forming fins 204 isolated by isolation structures 206. The method 300 proceeds to forming a dummy gate structure (not shown) and gate spacers 228 over the fins 204 and the isolation features 206. Then, the method 300 forms source/drain features 208 on the fins 204, followed by depositing a first ILD layer 210 over the isolation features 206 and the source/drain features 208. The method 300 then replaces the dummy gate structure with a high-k metal gate structure 220. Features of the device 200 may include similar compositions and be fabricated using similar methods as their counterparts of the device 100. For example, similar to the HK MG structure 120, the metal gate structure 220 comprises a high-k gate dielectric layer 222 and a gate electrode 224, which may further include multiple conductive material layers. The metal gate structure 220 may further comprise additional material layers (not shown) such as, for example, interfacial layers, capping layers, diffusion layers, barrier layers, or combinations thereof. The method 300 further implements a conductive layer 226 similar to the conductive layer 126 of the device 100 over the top surface of the HK MG structure 220. Thereafter, a second ILD layer 230 similar to the second ILD layer 130 of the device 100 is deposited over the conductive layer 226, portions of the HK MG structure 220, and the first ILD layer 210, and a contact feature 232 is formed in the second ILD layer 230 in a manner similar to that described with respect to forming the contact feature 132.

Although not limiting, one or more embodiments of the present disclosure offer improvements for semiconductor devices and methods of fabricating the same. For example, embodiments of the present disclosure provide a conductive layer formed between a metal gate structure and a contact feature in order to reduce high resistance at the interface between the metal gate structure and the contact feature caused by one or more work function metal layers present in the metal gate structure. The conductive layer is confined in a smooth boundary without extruding into the gate electrodes underneath, which will otherwise impact electrical property stability of the metal gate structure. Furthermore, formation of this conductive layer can be easily integrated into existing semiconductor fabrication processes.

Accordingly, the present disclosure provides many different embodiments for fabricating a semiconductor device. In one exemplary aspect, the present disclosure is directed to a method. The method includes forming a metal gate structure, wherein the metal gate structure includes a gate dielectric layer and a gate electrode; performing a surface treatment to a top surface of the metal gate structure, wherein the surface treatment converts a top portion of the gate electrode to an oxidation layer; forming a conductive layer above the gate electrode, wherein the forming of the conductive layer includes substituting oxygen in the oxidation layer with a metallic element; and forming a contact feature above the metal gate structure, wherein the contact feature is in direct contact with the conductive layer. In some embodiments, surface treatment includes applying plasma to the top surface of the metal gate structure. In some embodiments, the applying of the plasma and the forming of the conductive layer are in-situ. In some embodiments, the plasma comprising oxygen. In some embodiments, the forming of the conductive layer includes applying a cyclic deposition technique using two gaseous precursors. In some embodiments, one of the two gaseous precursors comprises the metallic element and a halogen element. In some embodiments, the metallic element is selected from a group of tungsten, cobalt, titanium, aluminum, gold, and copper. In some embodiments, the conductive layer extends from a position below the top surface of the metal gate structure to another position above the top surface of the metal gate structure. In some embodiments, the conductive layer further includes a metallic oxide, and wherein a concentration of the metallic oxide in the conductive layer increases in a direction towards the gate electrode. In some embodiments, the conductive layer is self-aligned with a top surface of the gate electrode but not with a top surface of the gate dielectric layer.

In another exemplary aspect, the present disclosure is directed to a method of forming a semiconductor structure. The method includes forming a metal gate structure including a gate dielectric layer and a gate electrode, wherein the gate electrode includes a first metal layer comprising a first metallic element and a second metal layer comprising a second metallic element, top surfaces of the first and second metal layers being coplanar; performing a passivation treatment to the top surfaces of the first and second metal layers, wherein the passivation treatment forms a compound over the gate electrode, the compound comprising the first and second metallic elements; forming a conductive layer by depositing a third metallic element above the metal gate structure, wherein the deposition converts the compound to an alloy comprising the first, second, and third metallic elements; and forming a contact feature above the metal gate structure, wherein the contact feature is in direct contact with the conductive layer. In some embodiments, the conductive layer includes a metallic film covering the alloy, wherein the metallic film comprising the third metallic element and being free of the first and second metallic elements. In some embodiments, the passivation treatment includes a plasma process with a gas selected from oxygen and nitrogen. In some embodiments, the compound includes a first metallic element oxide and a second metallic element oxide. In some embodiments, the conductive layer comprises tungsten and the contact feature comprises cobalt.

In yet another exemplary aspect, the present disclosure is directed to a semiconductor structure. The semiconductor structure includes a metal gate structure including a gate dielectric layer and a gate electrode, the gate electrode comprising at least one metal; a conductive layer formed above the gate electrode, the conductive layer including an alloy layer, the alloy layer comprising the at least one metal and a second metal, the alloy layer extending above a top surface of the metal gate structure; and a contact feature disposed above the metal gate structure, wherein the contact feature is in direct contact with a top surface of the conductive layer. In some embodiments, the conductive layer further includes a metallic layer over the alloy layer, the metallic layer comprising the second metal. In some embodiments, the at least one metal is selected from a group of tantalum, titanium, and aluminum, and the second metal is selected from a group of tungsten, cobalt, gold, and copper. In some embodiments, the conductive layer further includes a metallic oxide, wherein a concentration of the metallic oxide in the conductive layer increases in a direction towards the gate electrode. In some embodiments, a contact resistance at an interface between the contact feature and the conductive layer is lower than a contact resistance at an interface between the contact feature and the metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a metal gate structure, wherein the metal gate structure includes a gate dielectric layer and a gate electrode;
    performing a surface treatment to a top surface of the metal gate structure, wherein the surface treatment converts a top portion of the gate electrode to an oxidation layer;
    forming a conductive layer above the gate electrode, wherein the forming of the conductive layer includes substituting oxygen in the oxidation layer with a metallic element; and
    forming a contact feature above the metal gate structure, wherein the contact feature is in direct contact with the conductive layer.

2. The method of claim 1, wherein the surface treatment includes applying plasma to the top surface of the metal gate structure.

3. The method of claim 2, wherein the applying of the plasma and the forming of the conductive layer are in-situ.

4. The method of claim 2, wherein the plasma comprising oxygen.

5. The method of claim 1, wherein the forming of the conductive layer includes applying a cyclic deposition technique using two gaseous precursors.

6. The method of claim 5, wherein one of the two gaseous precursors comprises the metallic element and a halogen element.

7. The method of claim 6, wherein the metallic element is selected from a group of tungsten, cobalt, titanium, aluminum, gold, and copper.

8. The method of claim 1, wherein the conductive layer extends from a position below the top surface of the metal gate structure to another position above the top surface of the metal gate structure.

9. The method of claim 1, wherein the conductive layer further includes a metallic oxide, and wherein a concentration of the metallic oxide in the conductive layer increases in a direction towards the gate electrode.

10. The method of claim 1, wherein the conductive layer is self-aligned with a top surface of the gate electrode but not with a top surface of the gate dielectric layer.

11. A method of forming a semiconductor structure, comprising:

forming a metal gate structure including a gate dielectric layer and a gate electrode, wherein the gate electrode includes a first metal layer comprising a first metallic element and a second metal layer comprising a second metallic element, top surfaces of the first and second metal layers being coplanar;

performing a passivation treatment to the top surfaces of the first and second metal layers, wherein the passivation treatment forms a compound over the gate electrode, the compound comprising the first and second metallic elements;

forming a conductive layer by depositing a third metallic element above the metal gate structure, wherein the deposition converts the compound to an alloy comprising the first, second, and third metallic elements; and forming a contact feature above the metal gate structure, wherein the contact feature is in direct contact with the conductive layer.

12. The method of claim 11, wherein the conductive layer includes a metallic film covering the alloy, wherein the metallic film comprising the third metallic element and being free of the first and second metallic elements.

13. The method of claim 11, wherein the passivation treatment includes a plasma process with a gas selected from oxygen and nitrogen.

14. The method of claim 11, wherein the compound includes a first metallic element oxide and a second metallic element oxide.

15. The method of claim 11, wherein the conductive layer comprises tungsten and the contact feature comprises cobalt.

16. A method of forming a semiconductor structure, comprising:

forming a metal gate stack, the metal gate stack comprising a first metallic element and a second metallic element;

converting a top portion of the metal gate stack to an alloy, wherein the converting of the top portion of the metal gate stack includes introducing a third metallic element into the top portion of the metal gate stack, the third metallic element being different from the first and second metallic elements; and forming a gate contact feature over the alloy.

17. The method of claim 16, wherein the converting of the top portion of the metal gate stack also includes performing a passivation process to the top portion of the metal gate stack.

18. The method of claim 17, wherein the passivation process is an oxidation treatment or a nitridation treatment.

19. The method of claim 16, wherein a top surface of the alloy has a concave shape.

20. The method of claim 16, wherein the metal gate stack includes a capping layer and a gate electrode surrounded by the capping layer, and wherein a portion of the alloy is directly above the capping layer.

* * * * *